United States Patent
Gebuhr et al.

(10) Patent No.: US 9,780,271 B2
(45) Date of Patent: Oct. 3, 2017

(54) METHOD FOR PRODUCING OPTOELECTRONIC SEMICONDUCTOR COMPONENTS, ARRANGEMENT AND OPTOELECTRONIC SEMICONDUCTOR COMPONENT

(71) Applicant: OSRAM Opto Semiconductors GmbH, Regensburg (DE)

(72) Inventors: Tobias Gebuhr, Regensburg (DE); Michael Zitzlsperger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 182 days.

(21) Appl. No.: 14/346,673

(22) PCT Filed: Dec. 11, 2012

(86) PCT No.: PCT/EP2012/075100
§ 371 (c)(1),
(2) Date: Mar. 21, 2014

(87) PCT Pub. No.: WO2013/092308
PCT Pub. Date: Jun. 27, 2013

(65) Prior Publication Data
US 2015/0076549 A1 Mar. 19, 2015

(30) Foreign Application Priority Data
Dec. 20, 2011 (DE) .......... 10 2011 056 706

(51) Int. Cl.
*H01L 21/56* (2006.01)
*H01L 27/15* (2006.01)
(Continued)

(52) U.S. Cl.
CPC ........... *H01L 33/62* (2013.01); *H01L 24/97* (2013.01); *H01L 27/15* (2013.01); *H01L 33/005* (2013.01);
(Continued)

(58) Field of Classification Search
CPC ......... H01L 21/66; H01L 33/00; H01L 21/56; H01L 33/462; H01L 24/97; H01L 33/60;
(Continued)

(56) References Cited

U.S. PATENT DOCUMENTS 4,755,474 A * 7/1988 Moyer ................. H01L 31/167
250/551
6,905,891 B2 * 6/2005 Kovar ................ G01R 31/2831
257/655
(Continued)

FOREIGN PATENT DOCUMENTS

| DE | 102009032253 A1 | 1/2011 |
|---|---|---|
| EP | 2330645 A2 | 6/2011 |
| GB | 2413698 A | 11/2005 |

OTHER PUBLICATIONS

Lai, Y.S., et al., "Development and Performance Characterizations of a QFN/HMT Package," Electronic Components and Technology Conference, 2008. ECTC 2008. 58th, vol., No., May 27-30, 2008, pp. 964,967.

*Primary Examiner* — Kenneth Parker
*Assistant Examiner* — Young W Kim
(74) *Attorney, Agent, or Firm* — Slater Matsil, LLP

(57) ABSTRACT

In at least one embodiment of the method, the method is used to produce optoelectronic semiconductor components. A lead frame assemblage includes a plurality of lead frames. The lead frames each includes at least two lead frame parts and the lead frames in the lead frame assemblage are electrically connected to one another by connecting webs. The lead frame assemblage is fitted on an intermediate
(Continued)

carrier. At least a portion of the connecting webs is removed and/or interrupted. Additional electrical connecting elements are fitted between adjacent lead frames and/or lead frame parts. A potting body mechanically connects the lead frame parts of the individual lead frames to one another. The resulting structure is singulated to form the semiconductor components.

15 Claims, 7 Drawing Sheets

(51) Int. Cl.
| | | |
|---|---|---|
| *H01L 33/62* | (2010.01) | |
| *H01L 23/00* | (2006.01) | |
| *H01L 33/00* | (2010.01) | |
| H01L 21/66 | (2006.01) | |
| H01L 33/48 | (2010.01) | |

(52) U.S. Cl.
CPC ............ *H01L 22/32* (2013.01); *H01L 33/486* (2013.01); *H01L 2224/48091* (2013.01); *H01L 2224/48247* (2013.01); *H01L 2924/12036* (2013.01); *H01L 2924/12041* (2013.01); *H01L 2924/12042* (2013.01); *H01L 2924/19107* (2013.01); *H01L 2933/0066* (2013.01)

(58) Field of Classification Search
CPC ....... H01L 33/62; H01L 33/005; H01L 27/15; H01L 2933/0066; G11C 29/56016; G01R 31/2831
USPC ............ 438/15, 16, 17; 257/79, 98, 99, 666; 324/750.16

See application file for complete search history.

(56) References Cited

U.S. PATENT DOCUMENTS

| | | | |
|---|---|---|---|
| 8,076,181 B1 | 12/2011 | Pruitt et al. | |
| 9,219,210 B2* | 12/2015 | Zitzlsperger | H01L 24/97 |
| 2002/0016013 A1* | 2/2002 | Iketani | H01L 21/56 |
| | | | 438/15 |
| 2003/0071365 A1 | 4/2003 | Kobayakawa et al. | |
| 2004/0217369 A1* | 11/2004 | Nitta | H01L 25/0753 |
| | | | 257/99 |
| 2005/0067628 A1* | 3/2005 | Kuwabara | H01L 33/60 |
| | | | 257/98 |
| 2005/0274956 A1* | 12/2005 | Bhat | H01L 27/15 |
| | | | 257/79 |
| 2006/0055012 A1 | 3/2006 | Hsin Chen et al. | |
| 2009/0109668 A1 | 4/2009 | Isobe | |
| 2010/0187663 A1* | 7/2010 | Celaya | H01L 21/561 |
| | | | 257/666 |
| 2011/0133232 A1* | 6/2011 | Yoshioka | H01L 24/97 |
| | | | 257/98 |
| 2012/0122250 A1* | 5/2012 | Ji | G01R 31/2601 |
| | | | 438/15 |

* cited by examiner

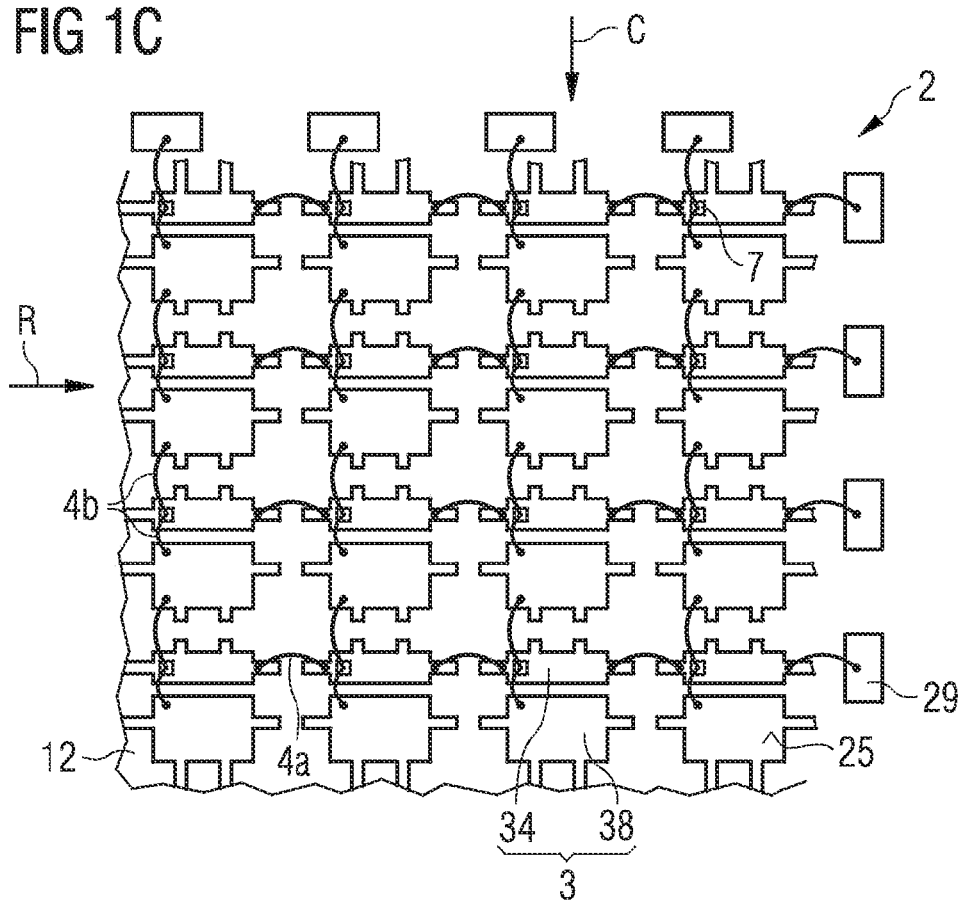
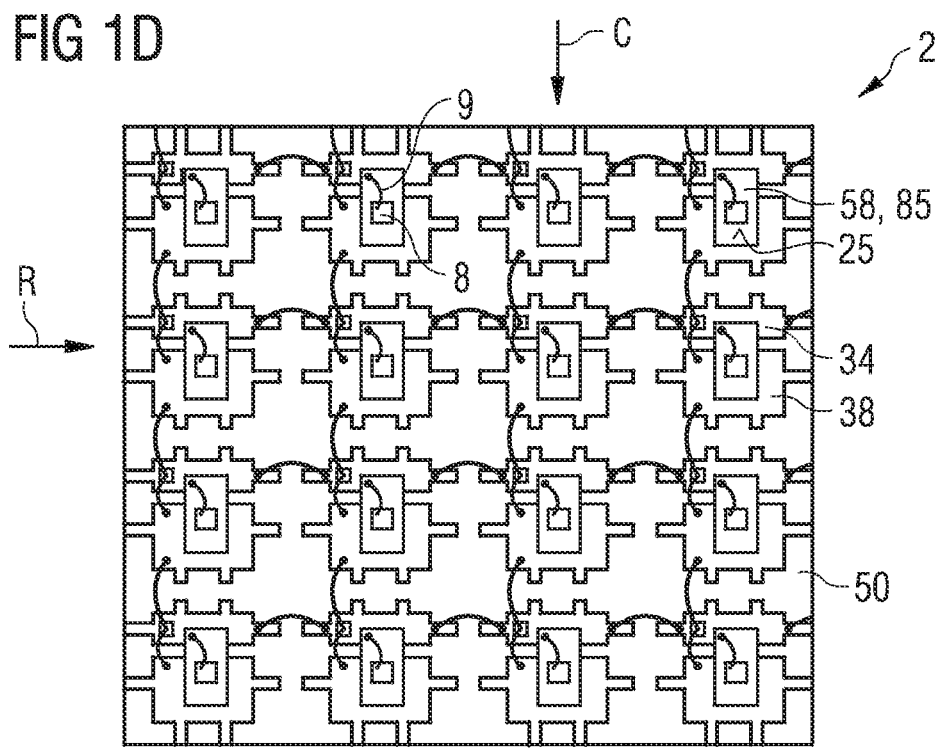

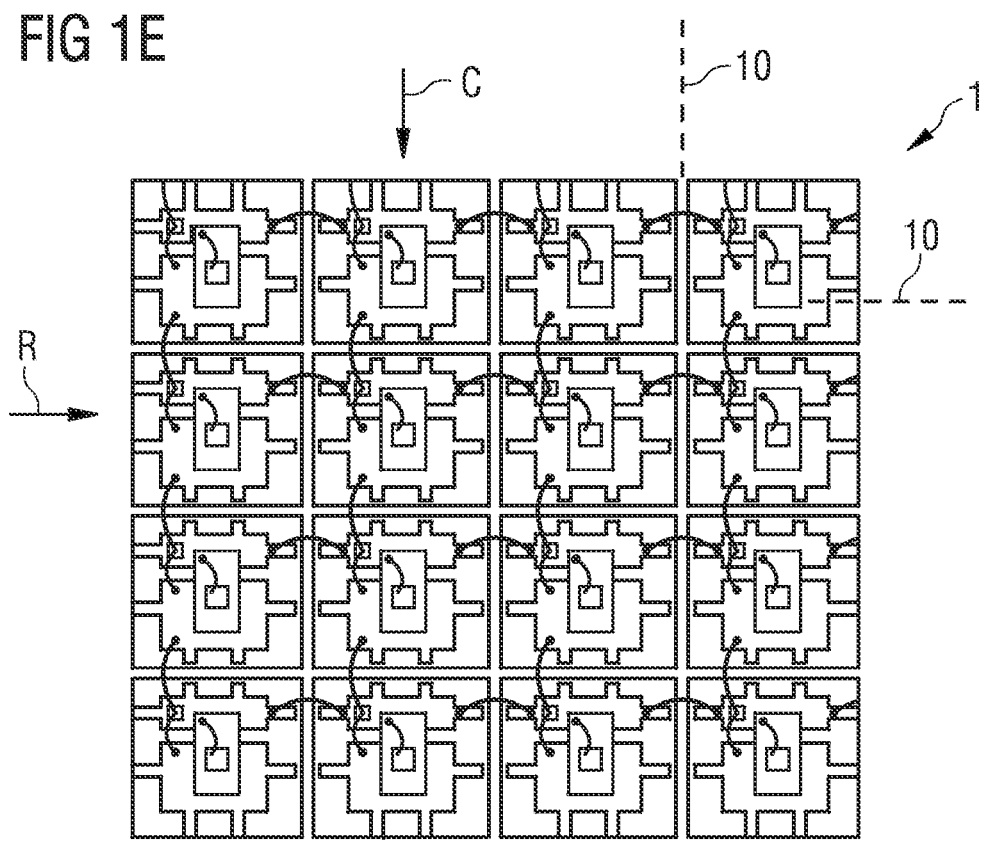

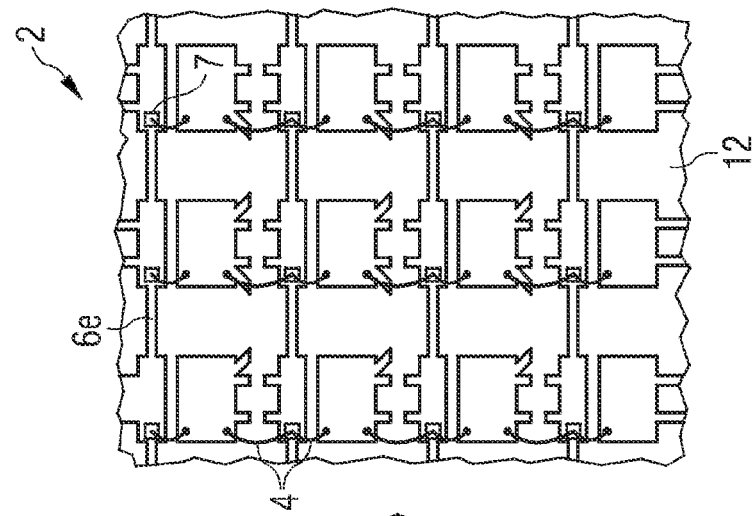
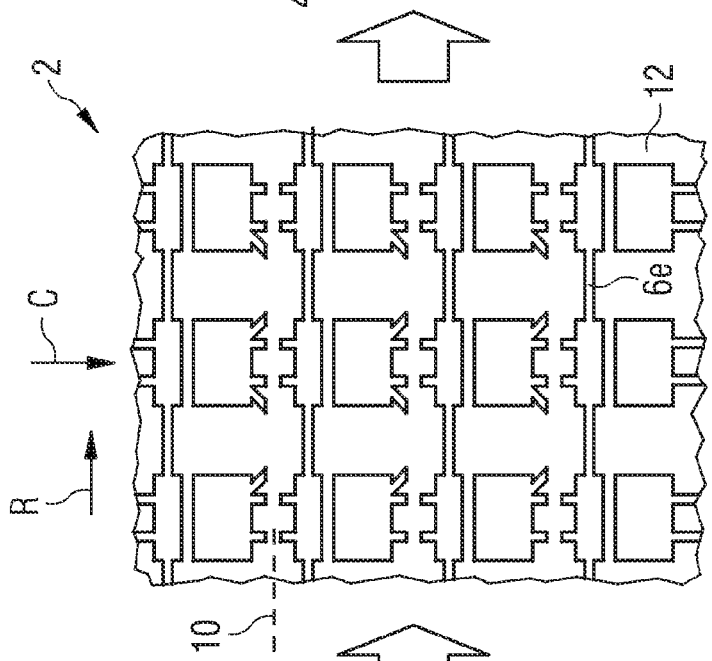
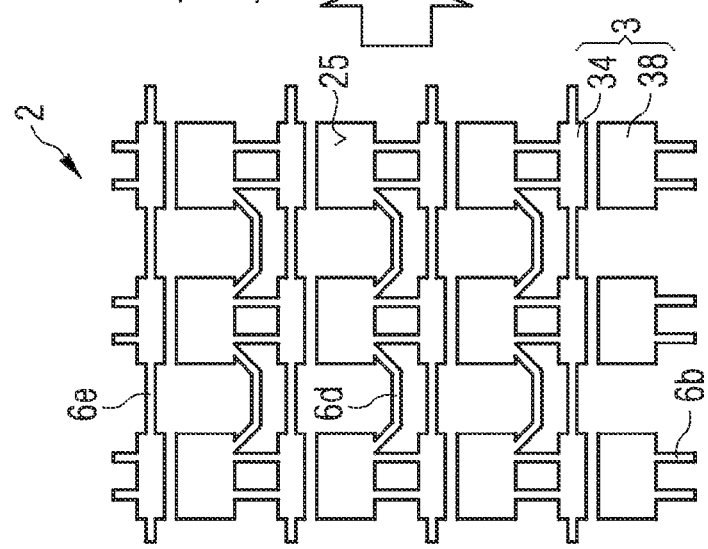

METHOD FOR PRODUCING OPTOELECTRONIC SEMICONDUCTOR COMPONENTS, ARRANGEMENT AND OPTOELECTRONIC SEMICONDUCTOR COMPONENT

This patent application is a national phase filing under section 371 of PCT/EP2012/075100, filed Dec. 11, 2012, which claims the priority of German patent application 10 2011 056 706.2, filed Dec. 20, 2011, each of which is incorporated herein by reference in its entirety.

TECHNICAL FIELD

A method for producing optoelectronic semiconductor components is provided. An arrangement having an intermediate carrier and a lead frame assemblage for producing optoelectronic semiconductor components is also provided. An optoelectronic semiconductor component which is produced by the method is also provided.

SUMMARY OF THE INVENTION

Embodiments provide a method for producing optoelectronic semiconductor components, wherein a high yield can be achieved with the method.

In accordance with at least one embodiment of the method, a lead frame assemblage is provided. The lead frame assemblage includes a plurality of lead frames. Preferably, each of the lead frames of the lead frame assemblage is provided for one of the semiconductor components to be produced.

In accordance with at least one embodiment of the method, each of the lead frames has at least two or precisely two or at least three or precisely three lead frame parts. The optoelectronic semiconductor component, for which the corresponding lead frame is intended, is electrically contactable and connectable via the individual lead frame parts of the lead frame.

In accordance with at least one embodiment, the lead frames and/or the lead frame parts are connected to one another electrically and at least intermittently in a mechanical manner at least in part via connecting webs of the lead frame assemblage. The connecting webs are formed preferably from the same material as the lead frames and the lead frame parts. In particular, the connecting webs are manufactured in one piece with the lead frames and the lead frame parts from the same metal sheet. In the finished semiconductor component, the connecting webs preferably no longer have any electrical and mechanical function.

In accordance with at least one embodiment, the method comprises the step of fitting the lead frame assemblage on an intermediate carrier. In particular, the intermediate carrier is a film (also referred to as foil), preferably consisting of Mylar. In particular, the intermediate carrier is located only intermittently on the lead frame assemblage. In a particularly preferred manner, the intermediate carrier does not form part of the finished semiconductor component.

In accordance with at least one embodiment, the method includes the step of removing and/or interrupting at least one portion of the connecting webs. The removal and/or interruption of the connecting webs is effected preferably by taking away material from the lead frame assemblage. For example, this occurs by etching, sawing, grinding and/or material removal by radiation such as laser ablation or laser cutting. The connecting webs can also be interrupted by punching or bending and/or tearing, e.g., by means of a bit.

It is possible for all of the connecting webs to be interrupted or removed. However, preferably only a portion of the connecting webs are interrupted or removed.

In accordance with at least one embodiment, the method comprises the step of fitting additional electrical connecting elements between adjacent lead frames and/or between adjacent lead frame parts and/or between adjacent connecting webs. The connecting elements are, e.g., electrically conductive strips, electrically conductive bypasses or, in a particularly preferred manner, bond wires. The connecting elements are different from the lead frame assemblage and are not produced in one piece therewith. In particular, the connecting elements are not formed from the same material as the lead frame assemblage.

In accordance with at least one embodiment of the method, it includes the step of creating a potting body for housing bodies of the individual semiconductor components. In particular, the potting body is produced by injection molding, transfer molding, casting, compression molding or liquid transfer molding.

In accordance with at least one embodiment, the potting body mechanically connects the individual lead frame parts of a lead frame to one another. If the lead frame assemblage and the potting body are then singulated to form the individual semiconductor components, the lead frame parts are then firmly connected to one another mechanically via the housing body, in particular exclusively via the housing body. In other words, the housing body can be the component which mechanically supports, carries and holds together the semiconductor component.

In accordance with at least one embodiment, the method includes the step of singulating the lead frame assemblage and/or the potting body to form the semiconductor components. Singulating is effected preferably by sawing. It is also possible to use punching, boring, bending, tearing, breaking or even laser radiation.

According to at least one embodiment of the method, the method is used to produce optoelectronic semiconductor components. A lead frame assemblage has a plurality of lead frames for the semiconductor components. The lead frames each comprise at least two lead frame parts and the lead frames and at least a portion of the lead frame parts in the lead frame assemblage are electrically connected to one another by connecting webs. The lead frame assemblage is fit on an intermediate carrier. At least a portion of the connecting webs is removed and/or interrupted. An additional electrical connecting element is fitted between adjacent lead frames and/or lead frame parts. A potting body for housing bodies of the individual semiconductor components, wherein the potting body mechanically connects the lead frame parts of the individual lead frames to one another The mechanically connected lead frame parts are singulated to form the semiconductor components.

Preferably, the individual method steps are performed in the sequence stated. Alternatively, they can also be performed in a sequence deviating therefrom.

In accordance with at least one embodiment, the produced optoelectronic semiconductor component is a QFN-component, wherein QFN stands for Quad Flat No Leads. Such components are surface-mountable.

In accordance with at least one embodiment, the lead frames are arranged matrix-like or array-like in the lead frame assemblage. Such a design of the lead frame assemblage is also defined as MAP-design.

In the case of QFN-semiconductor components such as QFN-LEDs, a semi-etched lead frame or lead frame assemblage is often used. In the lead frame assemblage, the lead frames for the semiconductor components are connected to their respective neighbor in an electrically conductive manner by means of connecting webs. Since optoelectronic semiconductor chips such as light-emitting diode chips are mounted and electrically contacted on the individual lead frames, they are then short-circuited. It is therefore not possible to perform functional testing or to connect the components before singulation.

By virtue of the fact that adjacent lead frames and/or lead frame parts are electrically connected to one another by means of connecting webs, separate connecting elements are used and the connecting webs are subsequently at least partially interrupted or removed, adjacent lead frames for the individual semiconductor components can be electrically isolated from one another and thus also can be electrically measured independently from one another, in particular from a rear side. In particular, a matrix circuit can be produced in the form of individual lines and columns. By using the intermediate carrier, testing can also be performed even before creation of the potting body and before singulation, which means that flaws such as poor electrical contacts or damaged components can still be eliminated.

Since testing and characterization are performed in the lead frame assemblage, it is not necessary to handle the individual components. A brightness of the individual semiconductor components and the chromaticity coordinate thereof can also be measured in the lead frame assemblage. As a result, a chromaticity coordinate of the emitted radiation can subsequently still be corrected and/or modified in the lead frame assemblage or even after singulation. It is also possible to use thermography, in particular to control the step of fitting the light-emitting diode chip, without needle-contacting of each individual light-emitting diode chip.

In accordance with at least one embodiment of the method, the step of fitting the connecting elements is performed after the step of removing and/or interrupting at least a portion of the connecting webs. In particular, this step of fitting the connecting webs is performed after the lead frame assemblage is applied in a one-piece condition on the intermediate carrier.

In accordance with at least one embodiment of the method, the connecting elements are fitted before the step of creating the potting body. In particular, the connecting elements are embedded into the potting body and/or are overlapped by the potting body.

In accordance with at least one embodiment of the method, a portion or all of each connecting element is partially or completely removed during singulating to form the semiconductor components. If singulation occurs, for example, by sawing, at least a portion of the connecting element is sawn through. If a connecting element is located completely in a sawing line, it would be completely removed.

In accordance with at least one embodiment of the method, the removal of the intermediate carrier is performed after creation of the potting body, in particular immediately after creation of the potting body. The lead frame assemblage can be mechanically stabilized by the potting body, so that the intermediate carrier is no longer required for mechanically holding together the lead frame assemblage for further method steps. Furthermore, the intermediate carrier is removed before singulation to form the semiconductor components. It is thus possible that the intermediate carrier is not also singulated and that the intermediate carrier is removed as a whole and in a contiguous manner from the lead frame assemblage and from the potting body.

In accordance with at least one embodiment of the method, it comprises the step of testing the as yet not singulated semiconductor components. During testing, in particular operational reliability of components such as protective diodes or light-emitting diode chips is examined. In this case, the light-emitting diode chips or the protective diodes can be supplied with current preferably line-by-line and column-by-column individually and independently of one another. The testing can be four-terminal sensing. In this case, a test contact is located preferably both at a beginning and at an end of each of the columns and lines. The semiconductor components can thus be tested electrically, thermally and/or optically in the lead frame assemblage.

In accordance with at least one embodiment of the method, after the step of removing or interrupting at least a portion of the connecting webs, the lead frame parts within a lead frame are no longer in direct electrical contact with one another. This can mean that a one-piece, electrically conductive material connection does not exist between the individual lead frame parts. For example, the lead frame parts within the lead frames are electrically connected to one another indirectly in each case only by means of electrical components such as the optoelectronic semiconductor chips. In particular, at least one pn-transition is arranged along a current flow direction between the lead frame parts within a lead frame.

In accordance with at least one embodiment of the method, first ones of the lead frame parts are electrically connected to form columns and second ones of the lead frame parts are electrically connected to form lines. For example, the optoelectronic semiconductor chips are each fitted on the first lead frame parts. The protective diodes can be fitted on the second lead frame parts. Preferably, each of the lead frames is allocated on a one-to-one basis precisely to one of the columns and precisely to one of the lines. Adjacent lines are preferably electrically isolated from one another, in the same way as adjacent columns. Then, by contacting one of the lines and one of the columns, a semiconductor chip can be electrically operated at an intersection point between this line and this column.

In accordance with at least one embodiment, the method comprises the step of fitting optoelectronic semiconductor chips such as light-emitting diode chips in each case on one of the lead frame parts or in each case on a plurality of lead frame parts of one of the lead frames. For example, the semiconductor chips are adhered or soldered onto a first one of the lead frame parts and are then electrically connected to a second one of the lead frame parts in particular with the aid of a bond wire. Alternatively, the semiconductor chips can be so-called flip-chips. An electrical connection between the two lead frame parts is then established preferably by the semiconductor chip itself.

In accordance with at least one embodiment of the method, the step of fitting the semiconductor chips is performed after creation of the potting body and before singulation to form the semiconductor components. In particular, the semiconductor chips are mounted in preferably truncated cone-shaped or truncated pyramid-shaped recesses of the potting body.

In accordance with at least one embodiment, the testing is performed completely or at least in part before creation of the potting body. For example, before the testing or this part of the testing, the connecting elements and/or protective diodes are applied to prevent damage from electrostatic discharges and are subsequently covered by the potting body or are embedded into the potting body. By testing before creation of the potting body, it is possible to eliminate errors when fitting in particular the protective diodes or defective protective diodes can be replaced or corresponding lead frames are subsequently not fitted with additional components.

In accordance with at least one embodiment of the method, the lead frames and/or the lead frame parts are electrically connected to one another at least in part in each case with the test contacts in the lead frame assemblage by means of the connecting webs. In particular, each of the test contacts is electrically connected directly to precisely one of the lead frame parts or to precisely one of the connecting webs. The direct electrical connection can be established by a material of the lead frame assemblage itself or even by an electrical connecting element such as a bond wire.

In accordance with at least one embodiment of the method, each of the lines and each of the columns comprises at least one of the test contacts. Preferably, each of the lines and each of the columns comprises precisely one or precisely two of the test contacts, wherein particularly preferably the test contacts are located in each case at an end and at a beginning of each of the lines and each of the columns. The test contacts can be electrically connected directly to a first one and a last one of the lead frame parts and/or the connecting webs of the respective lines and columns.

In accordance with at least one embodiment of the method, it includes the step of removing the test contacts after testing. In particular, during singulating to form the semiconductor components, the test contacts are separated from the semiconductor components, e.g., by sawing.

In accordance with at least one embodiment of the method, the lead frame assemblage has a plurality of test contacts. The test contacts are freely accessible at a top side of the lead frame assemblage. In this case, the top side is opposite a bottom side of the lead frame assemblage. In particular, the bottom side is the side of the lead frame assemblage which in the case of the finished semiconductor component is arranged for surface-mounting. The bottom side is in direct contact with the intermediate carrier preferably intermittently. During the method, the top side preferably does not come into contact with the intermediate carrier.

An arrangement having an intermediate carrier and a lead frame assemblage is also provided. The arrangement is used during implementation of a method as described in conjunction with at least one of the aforementioned embodiments. Features of the method are therefore also disclosed for the arrangement and vice versa.

In at least one embodiment, the arrangement comprises an intermediate carrier and at least one lead frame assemblage. The lead frame assemblage is provided for optoelectronic semiconductor components and comprises a plurality of individual lead frames. The lead frame assemblage is formed preferably in one piece. The individual lead frames are arranged in the form of a matrix. Each of the lead frames is provided for one of the semiconductor components and comprises in each case at least one first lead frame part and at least one second lead frame part. At least the first lead frame parts are provided for the purpose of applying a light-emitting diode chip thereon.

The lead frames are at least partially electrically connected to one another by means of connecting webs, in particular all of the lead frame parts are connected to one another by means of the connecting webs. The lead frame assemblage is reversibly fitted with a bottom side on the intermediate carrier, wherein the intermediate carrier is a film.

An optoelectronic semiconductor component is also provided which is produced by means of a method as described in conjunction with at least one of the aforementioned embodiments, with a lead frame assemblage. Features of the method and of the lead frame assemblage are also disclosed for the semiconductor component and vice versa.

In at least one embodiment, the semiconductor component has a lead frame having at least one first lead frame part and having at least one second lead frame part. The semiconductor component also includes one or a plurality of optoelectronic semiconductor chips such as light-emitting diode chips. The semiconductor chip is mechanically attached at least to the first lead frame part. A housing body mechanically connects the lead frame parts to one another and has a recess in which the semiconductor chip is fitted. The semiconductor component comprises one or a plurality of electrical connecting elements in the form of bond wires. The electrical connecting element is at the most in indirect electrical contact with the semiconductor chip. In particular, the semiconductor chip and the connecting elements are not in direct contact with one another and do not touch one another.

In accordance with at least one embodiment of the semiconductor component, it has a mounting side which is provided for mounting the semiconductor component. The lead frame parts are accessible exclusively on the mounting side for mounting purposes. In particular, the semiconductor components protrude from the housing body only on the mounting side or terminate flush with the housing body only on the mounting side.

In accordance with at least one embodiment of the semiconductor component, the connecting element is freely accessible on one or on a plurality of in particular opposing lateral surfaces of the housing body. Preferably, a material of the connecting element is exposed on at least one lateral surface and is not covered by a material of the housing body.

In accordance with at least one embodiment, as seen in a plan view of the lateral surface, the exposed connecting element is completely surrounded by a material of the housing body. In other words, the connecting element is not located on an edge but rather within the lateral surface.

BRIEF DESCRIPTION OF THE DRAWINGS

A method described in this case and a lead frame assemblage described in this case and a semiconductor component described in this case are explained in greater detail hereinafter with reference to the drawing and with the aid of exemplified embodiments. Like reference numerals designate like elements in individual figures. None of the references are illustrated to scale. Rather individual elements may be illustrated excessively large for ease of understanding.

FIGS. 1A to 1E show a schematic view of an exemplified embodiment of a method, described in this case, for producing an optoelectronic semiconductor component described in this case;

FIGS. 2A-2C, 3A-3B and 4 show schematic views of exemplified embodiments of lead frames for methods and semiconductor components described in this case.

DETAILED DESCRIPTION OF ILLUSTRATIVE EMBODIMENTS

Figure 1A:
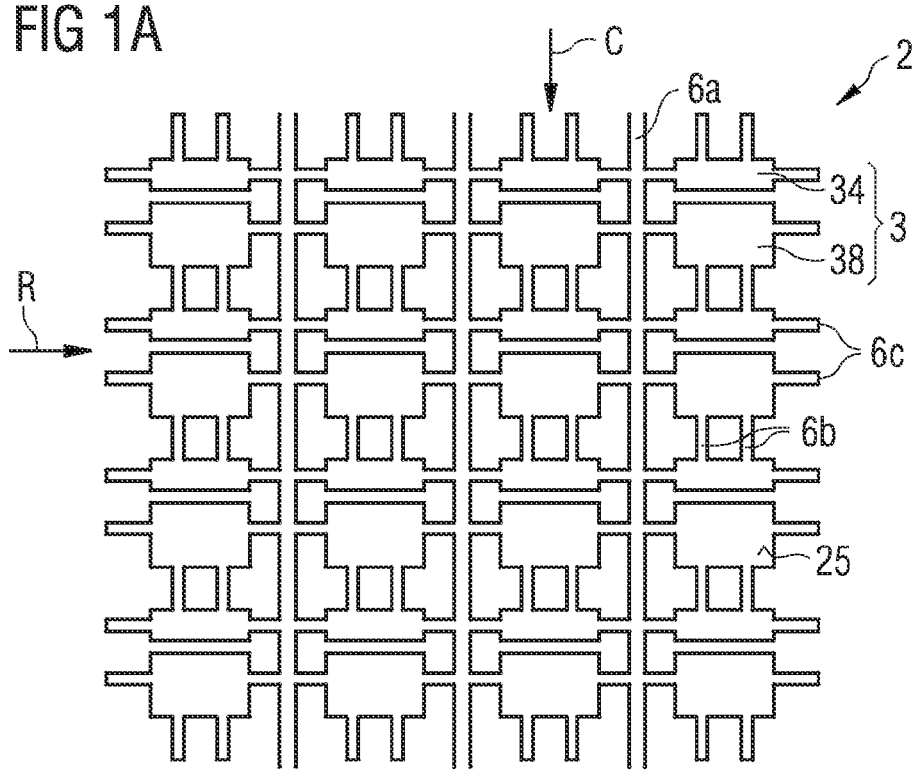

FIG. 1A schematically illustrates a plan view of a lead frame assemblage 2. The lead frame assemblage 2 comprises a plurality of individual lead frames 3 which are arranged in the manner of a matrix. Each of the lead frames 3 comprises two lead frame parts 34, 38. Adjacent lead frames 3 are connected to one another in one piece along columns C by means of connecting webs 6b and along lines R by means of connecting webs 6c. No connecting webs are provided between the lead frame parts 34, 38 within a lead frame 3. Optionally, in order to improve mechanical stabilization, additional connecting webs 6a are provided along the columns C.

The lead frame assemblage 2 is formed, e.g., from a copper sheet or a sheet formed from a copper alloy. For example, the lead frame assemblage 2 has lateral dimensions of approximately 70 mm×250 mm. The top side 25 and/or the bottom side 20 of the lead frame assemblage 2 can be partially or completely coated, also with multiple layers, using nickel, palladium, gold and/or silver. A thickness of the lead frame assemblage 2, perpendicular to the top side 25, is preferably between 150 μm and 400 μm inclusive, in particular approximately 200 μm.

Figure 1B:
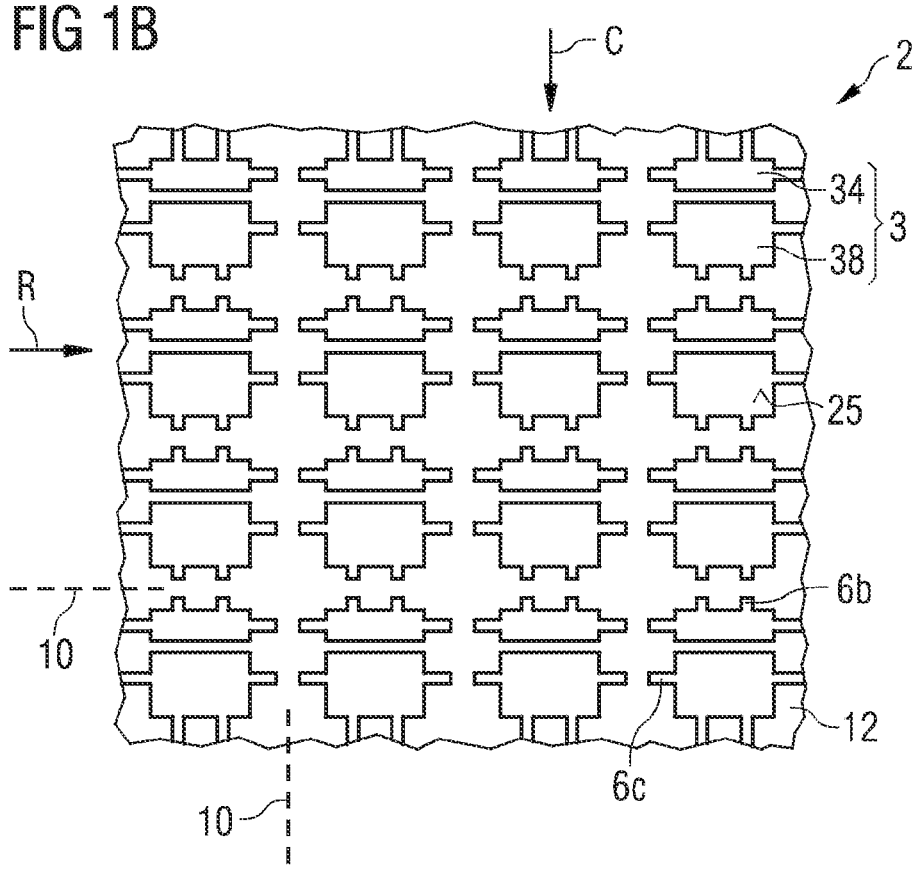

FIG. 1B illustrates further method steps for producing optoelectronic semiconductor components 1 from the lead frame assemblage 2. Firstly, the one-piece lead frame assemblage 2 is reversibly fitted on an intermediate carrier 12, in particular a Mylar film or foil, e.g., by means of an adhesive bond.

Subsequently, the connecting webs 6b, 6c are interrupted along singulating regions 10. The connecting webs are interrupted, e.g., by sawing, bending, breaking, tearing, scoring and/or etching. It is possible that the intermediate carrier 12 will become scored in particular during sawing. However, the mechanical integrity of the intermediate carrier 12 is not impaired or not substantially impaired by such scoring. In other words, the intermediate carrier 12 is not fragmented during interruption of the connecting webs. In the case of the embodiment in accordance with FIG. 1B, the optional connecting webs 6a are completely removed.

In a subsequent method step, see FIG. 1C, protective diodes 7 to protect against damage caused by electrostatic discharges are applied in each case onto the smaller, second lead frame parts 34. Subsequently, the connecting elements 4b which are formed by bond wires are applied along the columns C. The connecting elements 4b are each fitted with one end on the larger first lead frame part 38 and are each fitted with a second end on a top side of the protective diodes 7 facing away from the lead frame part 34. An electrical contact between the lead frame part 34 and the connecting elements 4b is thus established only indirectly by the protective diodes 7.

Along the lines R, the smaller lead frame parts 34 are directly electrically connected to one another by the connecting elements 4a. It is possible for the connecting elements 4a to be applied to remaining portions of the connecting webs 6c.

Optionally, test contacts 29 are located on the edge of the lead frame 3 which is arranged in the manner of a matrix. To simplify the illustration, the test contacts 29 are shown only in FIG. 1C. After the protective diodes 7 and the connecting elements 4a, 4b have been fitted, the lead frame assemblage can be electrically and thermally tested, in particular from a top side 25, by means of the test contacts 29. In contrast to the drawing, such test contacts 29 can be located at a beginning and at an end of the lines R and the columns C.

In a subsequent method step, see FIG. 1D, a potting body 50 is created, e.g., by injection molding or in particular so-called transfer molding. Adjacent lead frames 3 and the lead frame parts 34, 38 are mechanically connected to one another within the respective lead frames 3 by means of the potting body 50. Optionally, the protective diodes 7 and all or a portion of the connecting elements 4a, 4b are embedded into the potting body 50.

For ease of illustration, the potting body 50 is shown in an optically transparent manner in FIG. 1D. However, the potting body 50 is preferably manufactured from an opaque material which is not transmissive for visible light and/or is reflective for visible light.

In a further method step, optoelectronic semiconductor components 8, such as light-emitting diode chips, are fitted, e.g., adhered or soldered on the lead frame parts 38, see also FIG. 1D. Then, the light-emitting diode chips 8 are electrically connected to the lead frame parts 34 via bond wires 9. In contrast to the illustration, the light-emitting diode chips 8 can also be so-called flip-chips. Then, the light-emitting diode chips 8 are preferably directly applied both on the lead frame part 38 and the lead frame part 34.

In the method step in accordance with FIG. 1E, the lead frame assemblage 2 and the potting body 50 are singulated along the singulation regions 10 to form the individual semiconductor components 1. During singulation, the connecting elements 4a, 4b are severed and partially removed.

FIG. 2, which includes FIGS. 2A-2B, shows schematic plan views of a further lead frame assemblage 2 for an exemplified embodiment of a production method. The lead frame assemblage 2 comprises connecting webs 6d which connect the larger lead frame parts 38 to one another along the lines R. The connecting webs 6d run preferably in a U-shaped or V-shaped manner, see FIG. 2A. Optionally, additional connecting webs can also be present along the columns C, see, e.g., FIG. 1A.

In accordance with FIG. 2B, the lead frame assemblage 2 is fitted on the intermediate carrier 12 and the connecting webs 6b, 6d are partially removed and thus also interrupted along the lines R. The connecting webs 6e remain and form a one-piece, continuous electrical connection along the respective lines R with the lead frame parts 34.

FIG. 2C shows that the protective diodes 7 and the connecting elements 4 are fitted along the columns C. The further method steps can be performed in a similar manner to FIG. 1D and FIG. 1E.

Figure 3A:
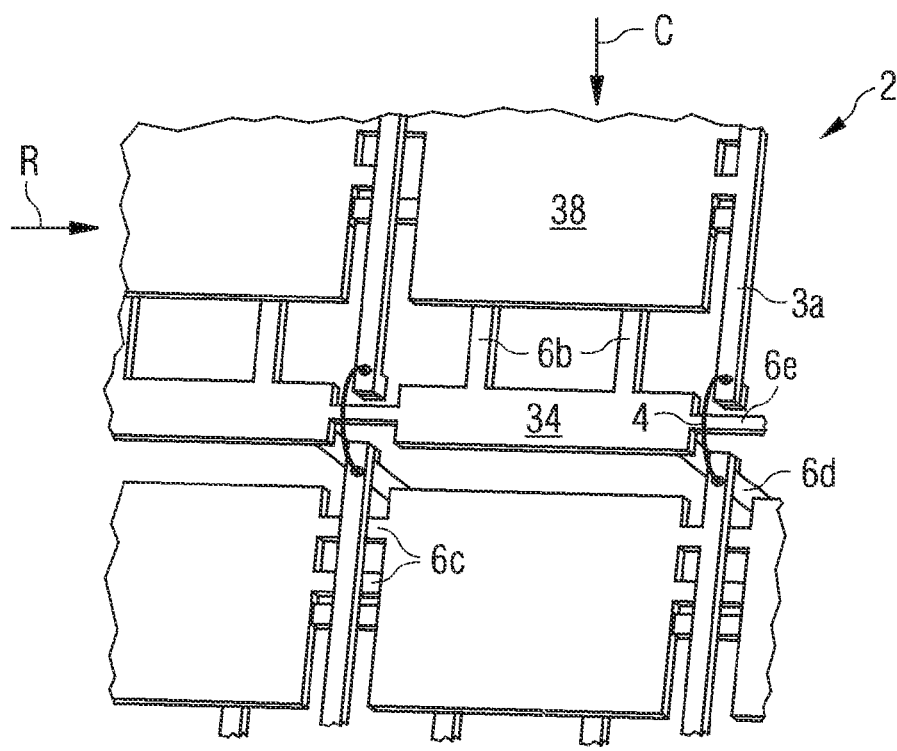
Figure 3B:
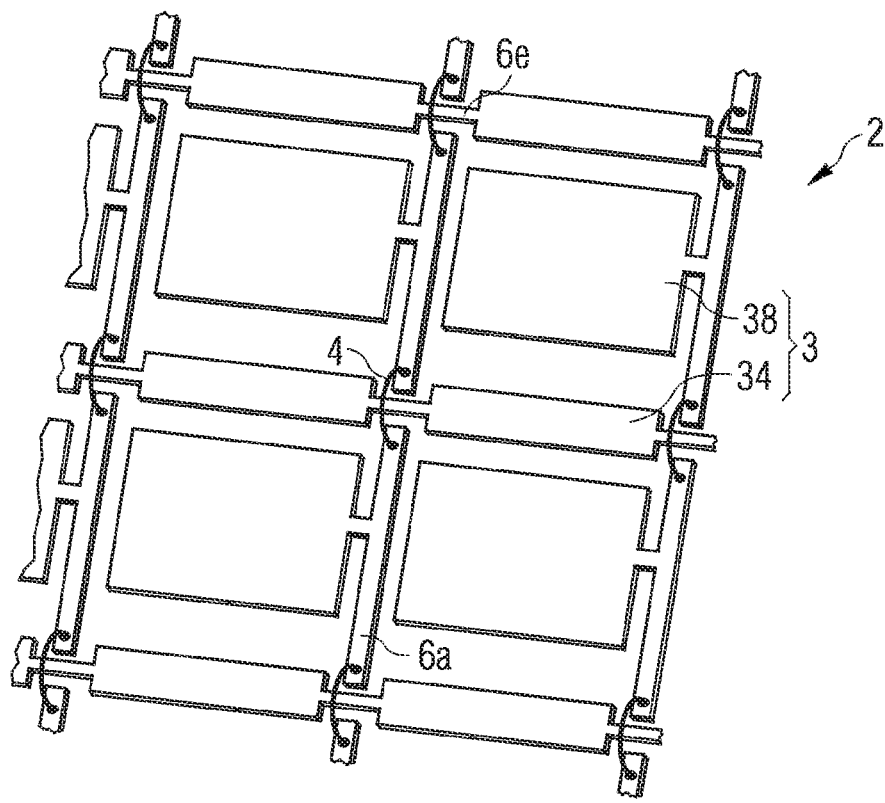

A further lead frame assemblage 2 for a method described in this case is shown in perspective plan views in FIGS. 3A and 3B. The lead frame assemblage 2 comprises, between adjacent lead frames 3 along the columns C, the connecting webs 6a which are electrically connected in series via the connecting elements 4. The lead frame assemblage 2 is then applied onto the intermediate carrier 12, not shown. Subsequently, the connecting webs 6b, 6d, 6c are at least partially removed, see FIG. 3A. An electrical connection along the columns C is thus achieved via the connecting webs 6a and the connecting elements 4.

Figure 4:
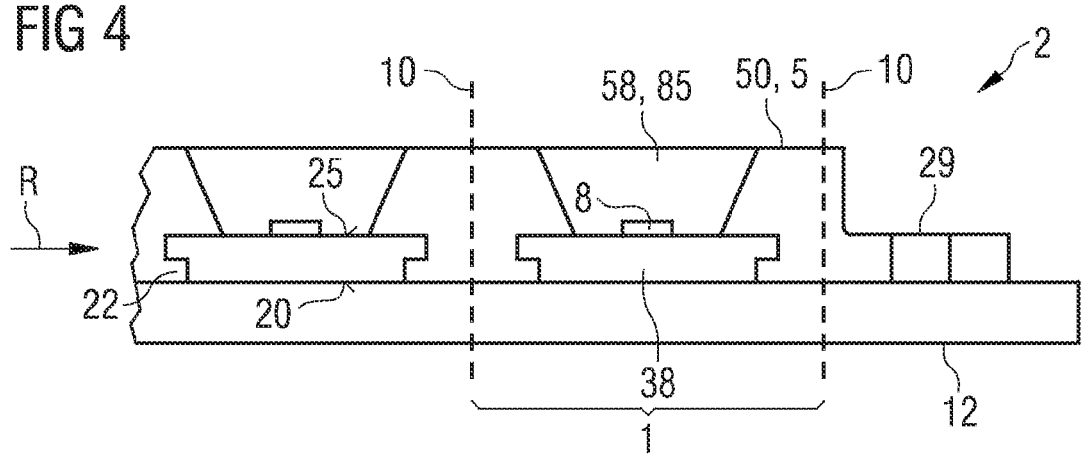

FIG. 4 illustrates a sectional view along one of the lines R. The singulation regions 10 are indicated by broken lines. As also in the case of all of the other exemplified embodiments, the lead frame assemblage 2 can comprise the test contacts 29, via which lines and columns which can be supplied with electric current independently of each other can be electrically contacted, in particular from the top side 25. During singulation to form the semiconductor components 1, the test contacts 29 can be removed which means that the test contacts 29 do not form part of the finished semiconductor components 1.

Figure 5A:
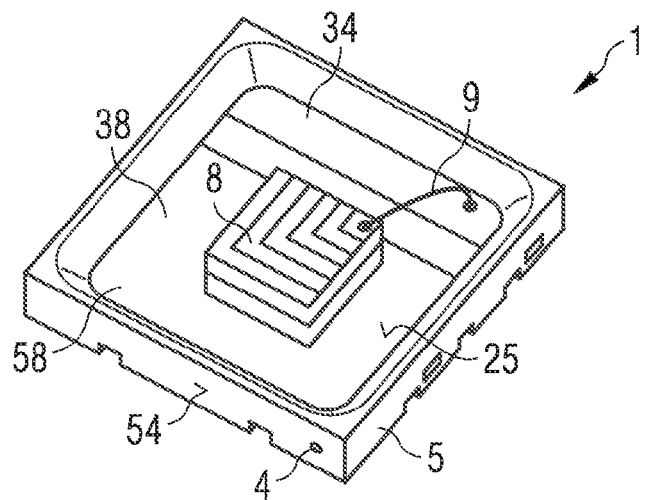
FIGS. 5A-5B and 6A-6B show schematic views of exemplified embodiments of optoelectronic semiconductor components described in this case.
Figure 5B:
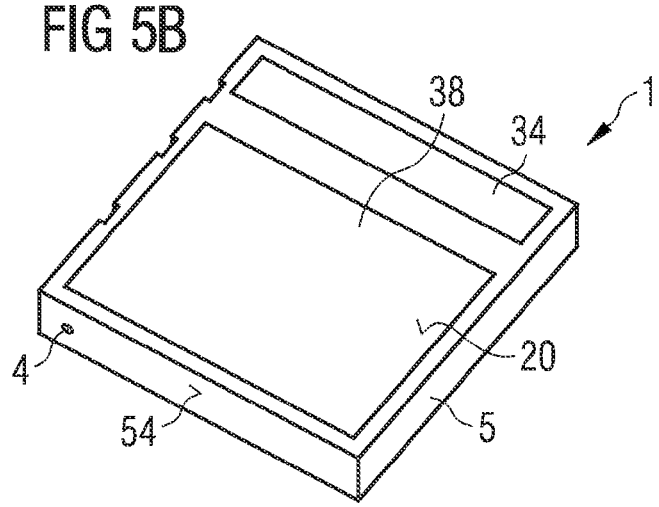

Exemplified embodiments of the finished semiconductor components 1 are illustrated in a perspective plan view in FIG. 5A and in a perspective bottom view in FIG. 5B (FIGS.

5A and 5B are collectively referred to as FIG. 5). The lead frame parts 34, 38 are each completely surrounded by a material of the housing body 5 on the bottom side 20 which is a mounting side of the semiconductor component. The semiconductor component 1 is surface-mountable with the bottom side 20. The light-emitting diode chip 8 is located preferably centrally in the recess 58. In contrast to the illustration, sidewalls of the recess 58 can be covered with a reflective material and/or with a material of the lead frame parts 34, 38.

On one lateral surface 54 of the housing body 5, the connecting element 4 is exposed and is completely surrounded by a material of the housing body 5, as seen in a plan view of the lateral surface 54. The connecting element 4 is preferably a relic of the connection to the columns C and to the lines R during the testing. In the finished semiconductor components 1, the connecting element 4 no longer exert any electrical or mechanical function. On the bottom side 20 of the semiconductor component 1, a plurality of slots can be seen which extend to the lateral surface 54. These slots are cavities which are filled before removal of the connecting webs 6b, 6c, 6d.

Figure 6A:
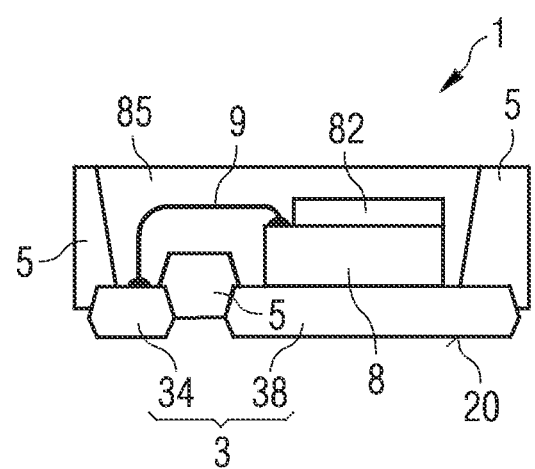
Figure 6B:
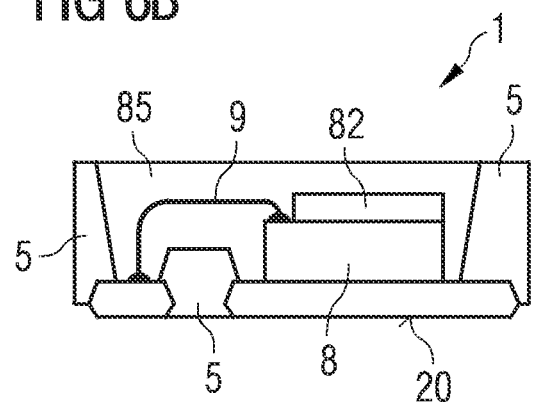

FIG. 6, which includes FIGS. 6A-6B, shows sectional views of further exemplified embodiments of the optoelectronic semiconductor components 1. The lead frames are machined, e.g., etched or punched from the bottom side 20 and from the top side 25. In accordance with FIG. 6A, the lead frame parts 34, 38 protrude from the housing body 5 at the bottom side 20. In accordance with FIG. 6B, the lead frame parts 34, 38 terminate at the bottom side 20 flush with the housing body 5. The lead frame parts 34, 38 are electrically connected to one another via the bond wire 9 and not via connecting webs, see also FIGS. 1A to 1C.

In accordance with FIGS. 5 and 6, the lead frame parts 34, 38 and the housing body 5 comprise, at the bottom side 20, partially oblique lateral surfaces and/or notches. In contrast to the drawing, the lateral surfaces of the lead frame parts 34, 38 and of the housing body 5 can also be smooth and oriented perpendicularly with respect to the bottom side 20.

Optionally, a wavelength conversion element 82 is fitted on the light-emitting diode chips 8. Radiation produced by the light-emitting diode chips 8 can be partially or completely converted into radiation of a different wavelength by means of the wavelength conversion element 82. Optionally, the recess 58 is filled partially or completely with a filling 85. Optical properties of the semiconductor component 1 can be adjusted by the filling 85. For example, the filling 85 comprises scatter particles. In contrast to the illustration, the filling 85 can also be formed in the shape of a lens. Such conversion elements 82 and/or fillings 85 can also be provided in all of the other exemplified embodiments.

The invention described in this case is not limited by the description using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. A method for producing optoelectronic semiconductor components, wherein the method comprises steps in the following sequence:
   providing a lead frame assemblage with a plurality of lead frames for the semiconductor components, wherein each lead frame comprises a plurality of lead frame parts, wherein the lead frames and at least a portion of the lead frame parts in the lead frame assemblage are electrically connected to one another by connecting webs, wherein the connecting webs are manufactured in one piece with the lead frames and the lead frame parts from the same metal sheet;
   applying the lead frame assemblage directly onto an intermediate carrier;
   removing and/or interrupting at least a portion of the connecting webs;
   fitting additional electrical connecting elements between adjacent lead frames which are different from one another, wherein the additional connecting elements are different from the lead frame assemblage and are not produced in one piece therewith so that the additional connecting elements are not formed from the same material as the lead frame assemblage;
   forming a potting body for housing bodies of the semiconductor components, wherein the potting body mechanically connects the lead frame parts of the lead frames to one another;
   testing the semiconductor components, wherein the semiconductor components are individually and independently of one another supplied with current line-by-line and column-by-column;
   removing the intermediate carrier; and
   singulating to form the optoelectronic semiconductor components.

2. The method according to claim 1, wherein the additional connecting elements comprise bond wires, and wherein at least a portion of the additional connecting elements is partially or completely removed during singulation.

3. The method according to claim 1, wherein, after partially removing and/or interrupting the connecting webs, the lead frame parts are not in direct electrical contact with one another within the respective lead frames,
   wherein first ones of the lead frame parts are electrically connected to form columns and second ones of the lead frame parts are electrically connected to form lines, and
   wherein adjacent lines and adjacent columns are each electrically isolated from one another.

4. The method according to claim 3, wherein
   each of the lines and each of the columns comprises at least one electrical test contact;
   in each case, one of the lead frame parts is directly electrically connected to one of the test contacts at one of each of the lines and one of each of the columns;
   the test contacts are freely accessible at a top side of the lead frame assemblage and the top side is opposite a bottom side arranged for surface-mounting of the semiconductor components; and
   the test contacts are removed before or during singulating.

5. The method according to claim 1, further comprising fitting light-emitting diode chips, each light emitting diode chip being fit on one of the lead frame parts or on two of the lead frame parts of one of the lead frames.

6. The method according to claim 5, wherein the light emitting diode chips are fitted after forming the potting body.

7. The method of claim 6, wherein the additional electrical connecting elements are exclusively directly applied to the lead frame parts and are at most in indirect electrical contact with the semiconductor components so that the semiconductor components and the additional electrical connecting elements are not in direct contact with one another and do not touch one another.

8. The method according to claim 5, further comprising fitting protective diodes to protect against damage caused by electrostatic discharges.

9. The method according to claim 8, wherein the protective diode are fitted before forming the potting body so that the protective diodes are covered by the potting body.

10. The method according to claim 8, wherein the protective diodes are fitted along columns on each second one of the lead frame parts, and wherein the additional connecting elements, which extend along these columns, are not brought into direct electrical contact with these lead frame parts.

11. The method according to claim 8, further comprising electrically testing the semiconductor components, wherein during the testing the protective diodes are supplied with current line-by-line and column-by-column independently of one another.

12. The method according to claim 11, wherein the testing comprises four-terminal sensing.

13. The method according to claim 11, wherein electrically testing is performed before forming the potting body and the protective diodes are covered by the potting body.

14. The method according to claim 1, wherein the testing comprises four-terminal sensing.

15. The method according to claim 1, wherein the lead frame parts, as seen in a plan view of a bottom side, are each completely surrounded by a material of the potting body after singulating.

* * * * *